United States Patent [19]

Boshra-Riad et al.

[11] Patent Number: 4,493,054

[45] Date of Patent: Jan. 8, 1985

[54] MAGNETIC BUBBLE STORE

[75] Inventors: Mokhtar Boshra-Riad, Giza, Egypt; Jean-Marc Fedeli, Saint Egreve, France; Hubert Jouve, Biviers, France; Daniel Mauduit, Rives sur Fure, France

[73] Assignee: Commissariat A L'Energie Atomique, Paris, France

[21] Appl. No.: 251,759

[22] Filed: Apr. 7, 1981

[30] Foreign Application Priority Data

Apr. 18, 1980 [FR] France .................. 80 08764

[51] Int. Cl.³ .................................. G11C 19/08
[52] U.S. Cl. .................................. 365/36; 365/19
[58] Field of Search ............ 365/15, 16, 19, 20, 365/21, 36

[56] References Cited

U.S. PATENT DOCUMENTS

| 3,916,397 | 10/1975 | Takahashi | 365/15 |
| 4,035,785 | 7/1977 | Kryder | 365/8 |
| 4,040,019 | 8/1977 | Bullock | 365/36 |
| 4,143,419 | 3/1979 | Bobeck | 365/36 |
| 4,237,544 | 12/1980 | Bonyhard | 365/15 |
| 4,314,358 | 2/1982 | Bobeck | 365/19 |

OTHER PUBLICATIONS

IBM Technical Disclosure Bulletin-vol. 23, No. 7B, Dec. 1980, pp. 3450-3452.
The Journal "IEEE Transactions on Magnetics", vol. 13, No. 6, Nov. 1977.
"Journal of Applied Physics", vol. 50, No. 3, Mar. 1979.

Primary Examiner—James W. Moffitt
Attorney, Agent, or Firm—Oblon, Fisher, Spivak, McClelland & Maier

[57] ABSTRACT

A magnetic bubble store including at least two series of longitudinally oriented major shift registers and a rotating magnetic field for producing a displacement of the bubbles in the minor registers. The series of minor registers are respectively arranged on either side of a transverse boundary. The minor registers of each of the series are constituted by motifs defined by ion implantation in a magnetic garnet layer. On either side of the boundary, these motifs define complementary distributions of implanted areas and non-implanted area.

5 Claims, 3 Drawing Figures

MAGNETIC BUBBLE STORE

BACKGROUND OF THE INVENTION

1. Field of the Invention

The present invention relates to a magnetic bubble store. It is applicable to the transfer of binary information or bits, materialized in the form of isolated zones called bubbles, within the store or to a station giving access to said information.

2. Description of the Prior Art

The magnetic bubbles are materialized in the form of isolated zones having a magnetization which is the opposite to that of the remainder of the magnetic material constituting the layer in which the bubbles are formed.

Each bubble can be displaced by a force and movement can take place freely in any direction in the plane of the magnetic layer. The magnetic layer is a magnetic garnet and the bubbles are formed in said layer by applying a d.c. magnetic field thereto perpendicular to the plane of the layer. This field is in practice produced by a permanent magnet and ensures the non-volatility of the data contained in the store.

The magnetic garnet layer in which the bubbles are formed is generally supported by a non-magnetic, monocrystalline garnet.

It is known to displace the bubbles by applying a rotary magnetic field, whose function is to create poles on e.g. permalloy motifs or patterns, having the shape of T-bars, chevrons or half-disks. As a result, shift registers are obtained in which the binary information is represented by the presence "1" or the absence "0" of a bubble. In addition to these permalloy motifs it is known that it is necessary to use electrical conductors for producing on the bubble store chip writing, data recording, nondestructive reading, transfers between registers and erasure functions. Erasure is performed in bitwise manner by the selective or overall destruction of the bubbles. This erasure is obtained very simply by increasing the value of the d.c. magnetic field beyond the maximum value permitted by the recording.

In order to displace the bubbles in the magnetic garnet layer two methods are at present used, whereby the bubbles can be displaced either by an electrical current or by a magnetic field.

The best known magnetic bubble store types are described below.

Stores constituted by a single looped register, which can be called series organization stores in which there is a single, very long, looped shift register. This register is provided with a single access station able to give access to only one bit at once. Although very simple this type of store requires a very long access time and does not permit any random access. The absolutely perfect manufacture thereof is required. Thus, any defect can lead to an interruption in the chain or string of bubbles representing the data contained in the store.

Stores having an organization into "minor-major registers". These stores comprise a system of recording loops called "minor registers", making it possible to record data. Another loop called the "major register" comprises the access station. The minor registers are longitudinally juxtaposed and the major register is oriented transversely. The magnetic bubbles contained in the minor registers can be transferred into the major registers via transfer gates. These gates make the structure and manufacture of the store more complicated. In addition, the access time is high, because the magnetic bubbles can pass through the entire length of the major register before reaching the access station, then follow an equivalent path for their return into the minor registers. Finally, the displacement in the minor register is unidirectional as a result of the synchronization constraints in the propagation of the bubbles between the minor registers and the major register.

Bubble stores comprising a series of shift registers or minor registers arranged in longitudinal manner and a transversely positioned major register. In this type of store the major register is called an access contour or outline and is incorporated into the minor registers, which thus participate by at least two bits in the access outline. In this case, the influence of the access outline can be prejudicial on the adjacent bubbles. Thus, by creating the magnetic field gradients necessary for the displacement of the bubbles on this access outline there can be a weakening of the adjacent bubbles in the store area in question.

In the case of the two latter store types, which generally use minor registers constituted by permalloy motifs shaped like a T, chevrons or half-disks it is impossible to ensure a transfer of the bubbles from one minor register to another. In the case of half-disks motifs, the distribution of the magnetic potentials along the major register is not homogeneous and during the transfer of the bubbles along said major register there are discontinuities in the field and can lead to a weakening of the bubbles.

SUMMARY OF THE INVENTION

The invention aims at obviating these disadvantages and more particularly at producing a bubble store in which the data contained in the longitudinally oriented minor shift registers can be transmitted bitwise to a transversely oriented access contour or outline as a result of the presence of a single tangency point between the end of each shift register and the access outline. Moreover, this bubble store makes it possible to facilitate and accelerate transfers, not only between the shift registers and the access outline, but also between shift registers belonging to different facing series of registers in the store. It also ensures access to two consecutive addresses of the same shift register by means of a single displacement in said register. It makes it unnecessary to use access stores, whose high resistance produces a significant dissipation in the known stores. The invention also makes it possible to produce stores by using planar technology without employing half-disk, T or chevron motifs or protuberant motifs, because it is no longer necessary to provide gates between the shift registers and the access outline. There is also no need to take account of phase displacements between the pulses permitting the transfer of bubbles in the access outline and the rotary field permitting the displacement of said bubbles in each of the shift registers. Finally, the memory according to the invention, as a result of the access outline having single tangency points with the various shift registers, makes it possible to place two access stations at each of the ends of said access outline and thus reduce the access time to the data contained in the shift registers. Transfers between registers within the same series of shift registers or in two adjacent series are also accelerated. Registers of two series of registers on either side of the access outline are complementary and, for the same position of the rotary field, the potential trough for these two series face one another and the bubbles trapped therein can be taken into account by the access outline without requiring a supplementary rotation of the rotary field. Under these conditions, as will be shown hereinafter, the two bubbles located respectively at the ends of the two registers can be taken into account for the access outline simultaneously and can be forwarded to two opposite access stations. As a result of this organization into complementary registers, the access time to a bubble is divided by two. It is therefore possible to double the reading and writing flow rate by arranging an access station on either side of the access outline, as will be shown hereinafter. Moreover, it is also possible to obtain access to two close consecutive addresses, because the rotary field is stopped during a reading or writing operation.

The invention relates to a magnetic bubble store comprising at least two series of longitudinally oriented minor shift registers and means for producing a displacement of the bubbles in said registers, said series of minor registers being respectively disposed on either side of a transverse boundary, wherein the minor registers of each of the series are constituted by motifs defined by ion implantation in a magnetic garnet layer, said motifs defining on either side of said boundary complementary distributions of implanted areas and non-implanted areas.

According to another feature of the invention, the memory also comprises two series of minor shift registers facing the major registers, said minor registers being constituted by motifs defined by ion implantation in the magnetic garnet layers and means for the transfer of bubbles between the registers of the series of major registers and the corresponding minor registers and between the minor registers corresponding to one another in the different series of minor registers.

According to another feature of the invention, the motifs of the series of major registers and the motifs of the minor registers corresponding thereto respectively define complementary distributions of implanted areas and non-implanted areas.

According to another feature of the invention, the motifs of different series of minor registers respectively define complementary distributions of implanted areas and non-implanted areas.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
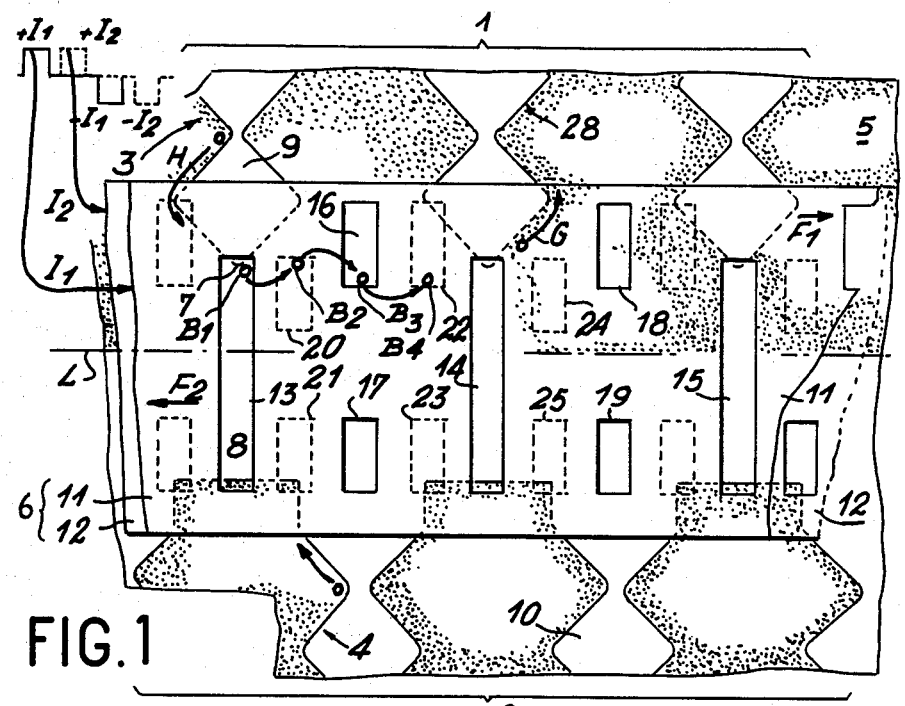
FIG. 1 diagrammatically, a first embodiment of a store according to the invention.

FIG. 1 diagrammatically shows a first embodiment of a bubble store according to the invention. This bubble store comprises two series 1, 2 of shift registers or minor registers 3, 4 which are longitudinally oriented, as well as known and not shown means for producing a displacement of the bubbles B in said registers, e.g. in the direction of arrow H, by applying a rotary magnetic field. The known means making it possible to apply a rotary magnetic field to the minor shift registers can be constituted by coils arranged in quadrature and rotating at a constant frequency. This rotary field can be eliminated and reestablished without disturbing the information in such a way that there is no need to energize the store when it is not operating. Obviously, this store comprises in per se known manner means which are not shown and which make it possible to produce the bubbles in the minor registers. These bubbles are produced, as required, e.g. by means of a conductor producing a field opposite to the polarization field. The longitudinal minor registers are constituted by motifs having the approximate shape of lozenges in the drawing, but which can be given any other appropriate shape and which are defined by ion implantation in a magnetic garnet layer 5. Such motifs are described in U.S. patent application Ser. No. 251,760, filed on Apr. 7, 1981 now U.S. Pat. No. 4,443,867. The magnetic garnet layer e.g. of formula GdYTmGaIG is implanted by masking the portions which are not to be implanted and by bombardment of $He^+$ ions. This ion implantation is defined in the manner described hereinafter, so that the bubbles formed circulate in a not shown layer of magnetic garnet, which can be called the recording layer and which is positioned below the layer 5 in which are defined the motifs constituting the shift registers. This recording layer can be made, for example, from a material for formula EuYTmGaIG. Finally, in per se known manner, the aforementioned two layers are supported by a nonmagnetic substrate e.g. of formula $Gd_3Ga_5O_{12}$. The series 1, 2 of minor registers 3, 4 are respectively located on either side of a boundary L or major register and in the particular case shown on either side of the transverse access outline 6. This transverse access outline comprises sheets 11, 12 and openings 13, 14, 15, 16, 17 . . . and constitutes a register which has a single access point for each access end 7, 8 of the minor registers 3, 4. As a result, access to each of the minor registers of series 1, 2 is effected bubble by bubble. According to the invention, the minor registers constituted by the motifs defined by ion implantation on either side of the access major register 6 form complementary distributions of the implanted areas and the non-implanted areas. Thus, in the embodiment shown in the drawing, the non-implanted areas for register series 1 are shown at 9, whilst the non-implanted areas for series 2 of minor registers 4 are shown at 10. The delimitation of the implanted area for register series 1 is indicated by line L. The major register 6 comprises for example electrical current access means which are constituted, in this embodiment of the store, by two conductive sheets 11, 12 superimposed on the magnetic garnet layer 5 in the vicinity of the access ends 7, 8 of minor registers 4, 3. These sheets are insulated from one another and from the magnetic garnet by layers of insulating material, which are not shown in the drawing. They are provided with openings arranged in such a way that at least one of the sheets, such as e.g. sheet 11 has openings 13, 14, 15 facing access ends 7, 8 of the minor registers. The other openings of these sheets are arranged so as to advance each bubble which has reached the end of e.g. minor registers 4, 3 to an access station or to other minor registers of the series of registers shown in the drawing. The openings such as 13, 14, 15, 16, 17, 18, 19 are produced in the conductive sheet 11, whilst the openings such as 21, 22, 23, 24, 25, etc are made e.g. in conductive sheet 12. When a bubble has reached one end, e.g. of a minor register 3, it can be forwarded by means of the access outline either to an access station or to another minor register of one of the series 1 or 2 of minor registers. To this end, not shown power supplies make it possible to apply current pulses $I_1$, $I_2$ to each of the conductive sheets 11, 12, so as to ensure the advance of the bubbles in the access outline. These pulses have a double polarity and respective amplitudes $+I_1$, $+I_2$, $-I_1$, $-I_2$. The access to a bubble located at the end of a minor register of the first register series 1 and a bubble located at the end of a minor register of the second register series 2, as well as the circulation of said bubbles takes place in the following manner. When a bubble has reached the end 7 of minor register 3 of the first series 1, the rotary field which was applied to the minor registers is stopped by appropriate means, then a pulse $+I_1$ is applied to conductive sheet 11. This pulse in per se known manner leads to the appearance of positive and negative poles on either side of opening 13 in such a way that the bubble is then attracted by the positive pole e.g. into position $B_1$ facing opening 13. A pulse $+I_2$ is then applied to the conductive sheet 12 in such a way that the positive and negative poles appear on either side of opening 20 made in said conductive sheet. The bubble is then attracted into position $B_2$ facing opening 20. A negative pulse $-I_1$ is then applied to the conductive sheet 11 and leads to the appearance of positive and negative poles on either side of opening 16. The bubble is then attracted into position $B_3$ facing opening 16. A pulse $-I_2$ is then applied to conductive sheet 12 in such a way that positive and negative poles appear in the manner shown in the drawing on either side of opening 22 in said sheet. The bubble is then attracted into position $B_4$. Thus, the bubble to which access was possible at end 7 of register 3 can be advanced in the direction of arrow $F_1$ to a not shown access station by the successive applications of pulses $I_1$ and $I_2$ as described hereinbefore.

At the time when the bubble faces opening 14, it is also possible to stop the application of pulses to conductive sheets 11, 12 and again apply the rotary field so as to circulate said bubble by successive displacements e.g. in register 28 up to a predetermined position in accordance with the travel indicated by arrow G. In the same way, a bubble which has reached end 8 of minor register 4 for example can be advanced by means of the access outline in the direction of arrow $F_2$ towards another access station. It can also be forwarded to a minor register of register series 1, because the access outline can be a looped outline. The same applies regarding a bubble collected in the minor register series 1, which can be forwarded to one of the registers of the series of complementary minor registers 2, because the major register can be looped. The advance of a bubble collected in one of the complementary minor registers of register series 2 will not be described in detail here, because it takes place in exactly the same way as the advance described hereinbefore in connection with a bubble collected in register series 1. The advance of a bubble collected in one of the minor registers of register series 2 takes place in the opposite direction to that described hereinbefore. Thus, the registers of series 1 and 2 are complementary and, for one and the same position of the rotary field, the potential troughs for these two series face one another and the bubbles trapped there are taken into account by the access outline, without involving a supplementary rotation of the rotary field. Thus, in the embodiment shown in the drawing, the two bubbles respectively positioned at ends 7, 8 of registers 3, 4 can be taken into account by the access outline simultaneously in order to be advanced towards two opposite access stations. As a result of this organization of complementary minor registers, the access time to a bubble is divided by two. Thus, it is possible to double the reading and writing flow rate by positioning an access station on either side of the major register, as will be seen hereinafter. Moreover, it is also possible to obtain access to two consecutive close addresses, because the rotary field is stopped during a reading or writing operation.

Figure 2:
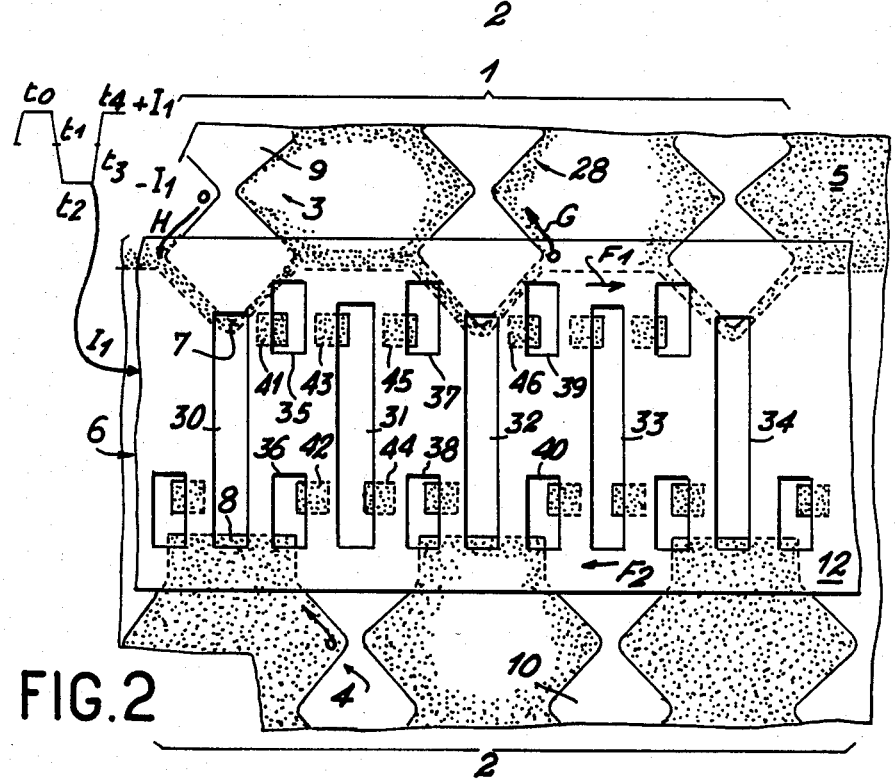
FIG. 2 diagrammatically, a second embodiment of a store according to the invention.

FIG. 2 diagrammatically shows another embodiment of a store according to the invention. The same components carry the same references in this drawing as in the previous drawing. It is possible to see the magnetic garnet layer 5 and the two series 1, 2 of complementary minor registers 3, 4, constituted by motifs defined by ion implantation in magnetic garnet layer 5. As hereinbefore, the non-implanted areas are shown at 9 within lozenges for the series of minor registers 1, whilst the implanted areas are shown at 10 for the series of complementary minor registers 2. In the series of major registers 1, the limit of the implanted area is indicated by the broken line L. According to this second embodiment of the store according to the invention, the access means or major register 6 to the minor registers of series 1, 2 comprise, for example, electrical current access means constituted by a conductive sheet 12 superimposed on the magnetic garnet layer 5 in the vicinity of access ends 7, 8 of the major registers. This sheet is insulated from the magnetic garnet layer by an insulating material layer, which is not shown in the drawing and which is provided with openings 30, 31 ... 40. Certain of these openings 30, 31, 32, etc face the access ends 7, 8 of the minor registers of register series 1, 2. The other openings 35, 36, 37, 38, 39, 40 cooperate with access motifs 41, 42, 43, 44, 45, 46 defined by ion implantation in the magnetic garnet layer 5 in such a way as to advance each bubble collected at the end of a minor register of each series either towards a not shown access station, in the direction of arrows $F_1$ or $F_2$, or to a register such as register 5, in the direction of arrow G. The passage of the bubbles in access outline 6 takes place in the following manner. Conductive sheet 12 is connected to a not shown power supply, which applies double polarity current pulses $I_1$ to said sheet. If a bubble is present, e.g. at end 7 of minor register 3 of register series 1, the rotary field is stopped by appropriate means and the bubble is attracted in front of opening 30 on the side of positive poles appearing in said opening, as a result of the application of a current pulse $+I_1$ to said conductive sheet at time $t_0$. At time $t_1$, the current in the conductive sheet is zero and the bubble faces motif 41. At time $t_2$, a negative pulse $-I_1$ is applied to conductive sheet 6 and positive and negative pulses appear on either side of opening 35. Thus, the bubble faces said opening on the side of the positive pole. At time $t_3$, the bubble faces motif 43, whilst at time $t_4$, the application of a positive pulse $+I_1$ to conductive sheet 6 leads to the appearance of positive and negative poles on either side of opening 31. The bubble is attracted in front of the upper part of opening 31. The process is identically reproduced in such a way that the bubble is advanced either to a not shown access station, in the direction of arrow $F_1$, or towards another minor register of the shift register series, e.g. register 28, in the direction of arrow G. Thus, when the bubble which has been taken into account at the end 7 of register 3 appears in front of opening 32, it is again possible to apply the rotary magnetic field in such a way that the bubble circulates in the opposite direction, e.g. in register 28. The bubbles taken into account in the lower part of the access outline or major register circulate in the opposite direction, in the direction of arrow $F_2$, to reach another, not shown access station or another register of the major register series 2.

As in the previous embodiment, it is also possible to circulate a bubble taken into account at the end of one of the registers of register series 1 in the access outline in order to bring it into one of the registers of register series 2 or vice versa. The minor registers of series 1 and 2, constituted by motifs defined by ion implantation, and having on either side of a boundary or access outline, complementary distributions of implanted areas and non-implanted areas make it possible, for one and the same position of the rotary field, to take into account the bubbles which have reached the ends of two facing registers and belonging to two different series of minor registers. This is due to the complementarity of the implanted areas and the non-implanted areas, making it possible to obtain facing potential troughs in the two series of registers. As in the previous embodiment, the access time can be reduced by half and it is possible to double the writing and reading flow rate by arranging an access station on either side of the access outline or major register.

Figure 3:
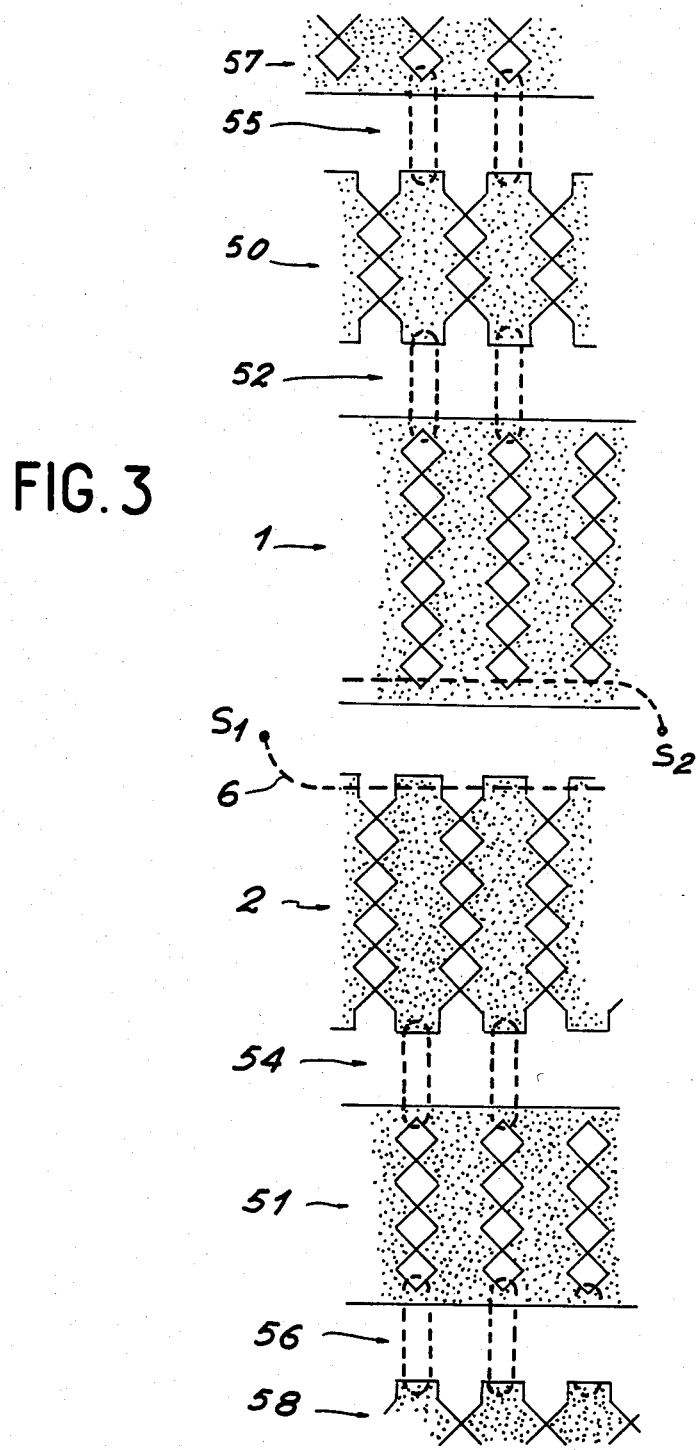
FIG. 3 diagrammatically, the general organization of a store according to the invention.

FIG. 3 diagrammatically shows the organization of a store according to the invention. According to this organization, the store is organized in groups of series of minor registers. A first group of series 1, 2 of minor registers faces a second group of series 50, 51 of minor registers. The displacements of bubbles in the minor registers are controlled by the rotary field application means described hereinbefore. As hereinbefore, these minor registers are constituted by motifs defined by ion implantation in a magnetic garnet layer. Means 52, 54 and 55, 56 are minor loops provided for ensuring the transfer of bubbles, respectively between minor registers 1, 2 and minor registers 50, 51 or between minor registers 50, 57 or between minor registers 51, 58. In the drawing, the implanted areas for example are represented by hatching in such a way that the motifs of the series of major registers and the motifs of the series of minor registers corresponding thereto respectively define complementary distributions of implanted areas and non-implanted areas. In the same way, the different series of minor registers, such as series 50, 57 for example, respectively define complementary distributions of implanted areas and non-implanted areas.

In the drawing, the transverse access means or major register is shown at 6. They make it possible to forward the bubbles to access stations $S_1$ or $S_2$. The transfer means 52, 54, 55, 56 or minor loop comprise, for example, at least electrical current transfer means and are not shown in detail here. They are formed in the same way as the access means or major register described in connection with the first embodiment of the invention. These transfer means comprise two conductive sheets superimposed on the magnet garnet layer in the vicinity of the ends of the registers. These sheets are insulated from one another and from the magnetic garnet and are provided with openings arranged in such a way that at least one of the sheets has openings tangential to the ends of the registers. The other openings of the sheets are arranged so as to transfer the bubbles between series of minor registers which correspond in the different minor register series of a second group (50, 57) for example, or between minor registers corresponding in the first group and second group (1, 50 for example).

According to another, not shown embodiment, the transfer means or minor loop are formed in the same way as the access means, described for example in connection with the second embodiment of the invention. For example, they comprise electrical current transfer means constituted by a conductive sheet superimposed on the magnetic garnet sheet in the vicinity of the ends of the registers. This sheet is insulated from the magnetic garnet layer and is provided with openings arranged in such a way that certain of them are respectively tangential with the ends of the registers. The other openings cooperate with the transfer motifs defined by ion implantation in the magnetic garnet layer in such a way as to transfer the bubbles between the corresponding minor registers. As described hereinbefore, these conductive sheets are energized by power supplies supplying double polarity current pulses.

The transfer means make it possible to control the data transfers between corresponding registers arranged longitudinally in the store. In this store organization according to the invention the distribution of the registers on either side of the access outline or major register makes it possible to reduce the access time. By retaining the same capacity for a given store surface, access can be obtained to the bubbles in the longitudinal registers at twice the speed. Moreover, due to the presence of the transfer means or minor loop, the data can be very rapidly transferred from one minor register to another within the store. Thus, it is possible to rapidly exchange between registers data pages.

The access outline or minor loop and transfer means described hereinbefore correspond to those described in U.S. patent application No. 251,760, filed on Apr. 7, 1981. It is obvious that they represent a particular realization of the invention and it is in particular possible for the transfer means not to use access outlines, replacing these e.g. by transfer gates associated with a longitudinally positioned loop. These gates are known in the art. They can be located at all transfer levels between minor registers, as shown in FIG. 3.

It is obvious that the access which has been taken as a current access, could be of another type without passing beyond the scope of the invention.

Obviously, numerous modifications and variations of the present invention are possible in light of the above teachings. It is therefore to be understood that within the scope of the appended claims, the invention may be practiced otherwise than as specifically described herein.

What is claimed is:

1. A magnetic bubble store comprising at least a first and second series of longitudinally oriented minor shift registers and means for producing a displacement of the bubbles in said registers, said first series of minor registers being disposed on one side of a transverse boundary and said second series of minor registers being disposed on the other side of said transverse boundary with said transverse boundary being constituted by a major register, wherein the minor registers of each of said first and second series are constituted by motifs defined by ion implantation in a magnetic garnet layer, said motifs defining respectively on said one side and said other side of said boundary, complementary distributions of implanted areas and non-implanted areas.

2. A bubble store according to claim 1, wherein the said boundary is a major loop organized as a shift register, said loop being constituted by storage points or minor registers of two series of the first group.

3. A bubble store according to claim 1 wherein the minor registers are organized in groups of series of minor registers at least a first and second group of series of minor registers defined by ion implantation in the magnetic layers, this store further comprising means for the transfer of bubbles between the corresponding minor registers of the first and second groups.

4. A bubble store according to claim 3, wherein the motifs of the corresponding minor registers of the first and second groups respectively define complementary distributions of implanted and non-implanted areas.

5. A bubble store, according to claim 3, wherein the transfer means are minor loops organized as shift registers and constituted by storage points of corresponding minor registers of two series of the first and second group respectively, or two series of the second group respectively.

* * * * *